United States Patent [19]

Denda

[11] Patent Number: 4,871,405

[45] Date of Patent: Oct. 3, 1989

[54] METHOD OF BONDING A SEMICONDUCTOR TO A PACKAGE WITH A LOW AND HIGH VISCOSITY BONDING AGENT

[75] Inventor: Masahiko Denda, Itami, Japan

[73] Assignee: Director General, Agency of Industrial Science and Technology, Japan

[21] Appl. No.: 175,182

[22] Filed: Mar. 30, 1988

[51] Int. Cl.[4] ............................................. C09J 5/04
[52] U.S. Cl. .................................. 156/74; 156/315; 357/80
[58] Field of Search ............... 156/314, 315, 290, 310, 156/74; 437/209, 231, 978, 946; 29/831; 357/80, 72, 74; 427/240, 407.1, 410; 428/620, 622, 623, 624, 626

[56] References Cited

U.S. PATENT DOCUMENTS

| | | | |
|---|---|---|---|
| 3,475,867 | 11/1969 | Walsh | 156/74 |
| 4,175,145 | 11/1979 | Fechter | 427/407.1 |
| 4,190,855 | 2/1980 | Inoue | 357/72 X |
| 4,209,358 | 6/1980 | DiLeo et al. | 156/293 |
| 4,377,619 | 3/1983 | Schonhorn et al. | 428/333 |
| 4,604,644 | 8/1986 | Beckham et al. | 357/80 |
| 4,741,926 | 5/1988 | White et al. | 437/231 |
| 4,745,018 | 5/1988 | Chihara et al. | 428/141 |

FOREIGN PATENT DOCUMENTS

| | | | |
|---|---|---|---|
| 0034053 | 11/1975 | Japan | 156/315 |
| 0087448 | 7/1980 | Japan | 437/209 |
| 0052833 | 3/1983 | Japan | 357/74 |
| 0044834 | 3/1984 | Japan | 437/209 |
| 0231392 | 11/1985 | Japan | 29/831 |

OTHER PUBLICATIONS

Tower et al, "Design and Performance . . . Focal Planes", RCA Review, vol. 47, Jun. 1986, pp. 226–255.
Bolger et al, "Failure Mechanisms . . . Encapsulated I.C.'s", IEEE 1983, pp. 227–231.
Bolger et al., "Die Attach in . . . Polyimides", IEEE 1984, pp. 63–67.

Primary Examiner—Michael W. Ball
Assistant Examiner—Steven D. Maki
Attorney, Agent, or Firm—Leydig, Voit & Mayer

[57] ABSTRACT

A semiconductor device comprising a semiconductor element, a support member for supporting the semiconductor element on the support member. The bonding layer comprises element and a bonding layer for bonding the semiconductor a hard layer of a high-viscosity bonding agent which has a high viscosity before curing and which has an irregular free surface defining projections and cavities, and a soft layer of a low-viscosity bonding agent which has a low viscosity before curing and disposed within the cavities in the irregular free surface of the hard layer to fill them. The hard layer defining a portion of the bonding surfaces and the soft layer defining the remaining portion of the bonding surface provide a continuous hybrid bonding surface for the bonding layer. A process for bonding a semiconductor element to a support member is also disclosed.

5 Claims, 1 Drawing Sheet

METHOD OF BONDING A SEMICONDUCTOR TO A PACKAGE WITH A LOW AND HIGH VISCOSITY BONDING AGENT

BACKGROUND OF THE INVENTION

This invention relates to a semiconductor device in which a semiconductor element is bonded to a support structure and a process for bonding a semiconductor element to a support structure.

The die bonding for use in bonding a die (semiconductor element) to a semiconductor element support structure such as a package or a substrate typically includes a gold-silicon eutectic bonding and a solder bonding. In recently developed devices such as color image sensors including a color filter which are less heat resistant applying the low-viscosity bonding agent while spinning the package directly formed on a semiconductor element, such as infrared ray detectors in which the semiconductor element is used at a cryogenic temperature as low as nitrogen liquidifying temperature (77° K.).

In the die bonding, the color image sensor, the gold-silicon eutectic bonding method, or a solder which needs an elevated temperature cannot be used since the color filter used is not heat-resistant. Therefore, a bonding agent containing silver powders or a bonding agent of the type cured by ultraviolet rays is used. In the infrared ray detector, formed by the gold-silicon eutectic bonding method or a solder material are too rigid to accommodate the difference between the thermal expansions of the semiconductor element and the container vessel or the package. These bonds cause destruction of the semiconductor element at the bonded portion. Therefore, a low-temperature bonding agent which is relatively flexible and strong at low temperatures is used in the infrared ray detector.

The low-temperature bonding agents generally used are an epoxy or a urethane bonding agent curable at room temperature. Such bonding agents include Hisol (trade name) and Crest (trade name). These low-temperature bonding agents when cured have a sufficient flexibility or softness as well as a sufficient adhesion strength at cryogenic temperatures. However, since these bonding agents before curing have a high viscosity, of from 2,500 cps to 100,000 cps, it is very difficult to apply such the bonding agent to the surface to be bonded in a uniform thickness.

FIG. 1 illustrates, in cross section, a conventional semiconductor device 1 of the type to which the present invention is applicable. The semiconductor device 1 comprises a semiconductor chip 2, a support structure which is illustrated as a package 3 for containing therein and supporting the semiconductor element 2, and a bonding layer 4 of a bonding agent disposed between the semiconductor element 2 and the package 2 for bonding the semiconductor element 2 on the package 3. The bonding layer 4 is applied on the package 3 with a manual applicator (not shown) such as a putty knife or a brush to form a bonding surface 5 bonded to the package 3 and a bonding surface 6 to which the semiconductor element 2 is to be bonded. The bonding agent of the bonding layer 4 has a relatively high viscosity, so that the bonding surface 6 of the layer 4, before the semiconductor element 2 is placed on it, is an irregular free surface. This irregular free surface has projections 7 and cavities 8. Then, the semiconductor element 2 is pressed onto the bonding surface 6 of the bonding layer 4, and the bonding agent of the bonding layer 4 is cured.

The semiconductor device 1 thus manufactured has a number of cavities 8 or voids at the interface between the semiconductor element 2 and the bonding layer 4 because the relatively hard, highly viscous bonding agent of the bonding layer 4 is manually applied. Therefore, the bonding surface 6 of the bonding layer 4 only partially contacts and adheres with the semiconductor element 2, providing only a limited contact area between the die bonding region of the semiconductor element 2 and the package 3.

The voids formed by the cavities 8 between the semiconductor element 2 and the bonding layer 4 lower the thermal conduction between the semiconductor element 2 and the package 3. Also, during the thermal cycling of the semiconductor device 1 while in use, the moisture trapped within the voids 8 is repeatedly evaporated and condensed and the air pressure within the voids 8 changes. These factors significantly degrade the reliability of the semiconductor device.

SUMMARY OF THE INVENTION

Accordingly, an object of the present invention is to provide a semiconductor device in which the bonding surface of the bonding layer is smooth and has substantially no voids.

Another object of the present invention is to provide a semiconductor device in which the voids in the bonding layer of the bonding agent are eliminated.

Still another object of the present invention is to provide a semiconductor device in which the semiconductor element is firmly and reliably bonded to the support structure.

A further object of the present invention is to provide a semiconductor device in which a superior heat conduction can be established between the semiconductor element and the support structure.

Another object of the present invention is to provide a process for bonding a semiconductor element to a support structure by a bonding agent with a high reliability.

A further object of the present invention is to provide a process for bonding a semiconductor element to a support structure by a bonding agent with substantially no voids.

With the above objects in view, the semiconductor device of the present invention comprises a semiconductor element, a support member for supporting the semiconductor element and a bonding layer for bonding the semiconductor element to the support member. The bonding layer comprises a hard layer of a high-viscosity bonding agent which has a high viscosity before curing and which has an irregular free surface defining projections and cavities, and a soft layer of a low-viscosity bonding agent which has a low viscosity before curing and is disposed within the cavities in the irregular free surface of the heard layer to fill them. The hard layer defines a portion of the bonding surfaces and the soft layer defines the remaining portion of the bonding surface to provide a continuous hybrid bonding surface for the bonding layer.

According to the process for bonding a semiconductor element, a high-viscosity bonding agent which has a high viscosity before curing is applied to a support member to provide a hard layer having an irregular free surface defining projections and cavities therein. A low-viscosity bonding agent which has a low viscosity before curing is applied to the irregular surface of the hard layer to fill the cavities with the low-viscosity bonding agent to provide a soft layer. Thus, a continuous hybrid bonding surface which is partially defined by the projections of the hard layer and partially defined by the soft layer filled in the cavities of the hard layer is formed. Finally, a semiconductor element is pressed onto the hybrid continuous bonding surface and the bonding agents are cured.

BRIEF DESCRIPTION OF THE DRAWINGS

The present invention will become more readily apparent from the following detailed description of the preferred embodiment of the present invention shown by way of example in the accompanying drawings, in which.

DESCRIPTION OF THE PREFERRED EMBODIMENT

Figure 2:
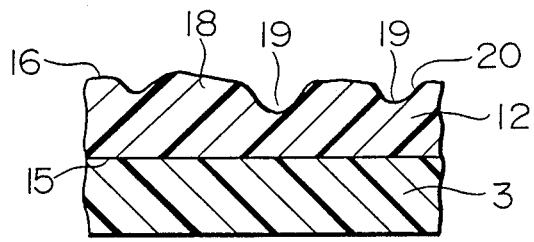
FIG. 2 is a sectional view showing a step of the semiconductor element bonding process of the present invention in which a hard layer having the cavities in its surface is formed on the support member.
Figure 3:
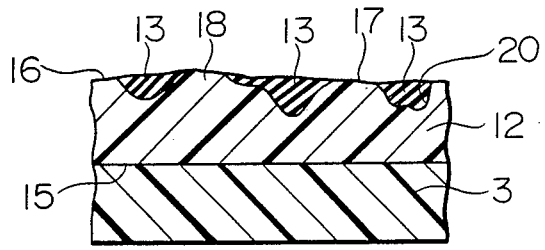
FIG. 3 is a sectional view showing a step of the process of the present invention in which a soft layer of a soft bonding agent is filled within the cavities of the hard layer.
Figure 4:
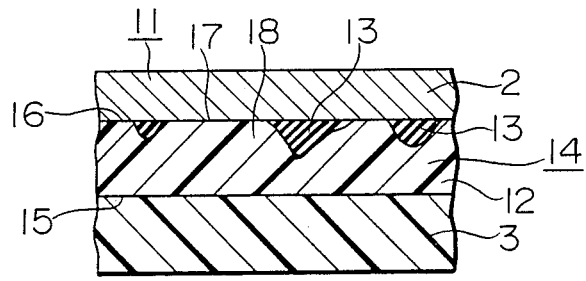
FIG. 4 is a sectional view showing a step of the process of the present invention in which semiconductor element is bonded to provide the semiconductor device of the present invention.

FIGS. 2 to 4 illustrate, in cross section, various steps of the semiconductor element bonding process of the present invention, FIG. 4 showing a semiconductor device 11 in which the bonding process is carried out according to the present invention. The semiconductor device 11 shown in FIG. 4 comprises a semiconductor element 2, a support mmber which is illustrated as being a package 3 for containing therein and supporting the semiconductor element 2, and a bonding layer 14 of a bonding agent disposed between the semiconductor element 2 and the package 3 for bonding the semiconductor element 2 on the package 3. The bonding layer 14 is bonded to the package 3 at the upper bonding surface 14 and to the semiconductor element 2 at the lower bonding surface 16. The bonding layer 14 comprises a hard layer 12 and a soft layer 13 disposed on the hard layer 12. It is seen that the hard layer 12 defines a portion of the upper bonding surface 16 and the soft layer defines the remaining portion of the upper bonding surface 16 to define together a continuous hybrid bonding surface 17.

In FIG. 2, the hard layer 12 is applied on the chemically or mechanically cleaned surface on the package 3 with a manual applicator (not shown) such as a putty knife or a brush to form the bonding surface 15 bonded to the package 3 and the bonding surface 16. The bonding agent of the hard layer 12 is a high-viscosity bonding agent which has a relatively high viscosity before curing, so that the bonding surface 16 of the hard layer 12 before the semiconductor element 2 is placed on it is an irregular free surface 20 and has projections 18 and cavities 19. The high-viscosity bonding agent which may be used for the hard layer 12 includes a low-temperature bonding agent or an epoxy resin bonding agent. The viscosity of such the bonding agent before curing may preferably be from 2,500 cps. to 100,000 cps.

Then, as illustrated in FIG. 3, a low-viscosity bonding agent which has a relatively low viscosity before curing is applied on the irregular free surface 20 of the hard layer 12 to fill the cavities 19 with the low-viscosity bonding agent to provide a soft layer 13. The soft layer 13 may be applied by applying the low-viscosity bonding agent while spinning the package for the purpose of removing excess low-viscosity bonding agent from the irregular surface 20 of the hard layer 12. Thus, it is seen that a continuous hybrid bonding surface 17 which is partially defined by the projections 18 of the hard layer 12 and partially defined by the soft layer 13 filled in the cavities 19 of the hard layer 12 is provided on the bonding layer 14. The bonding agent which may be used for the soft layer 13 includes an urethane resin bonding agent. The viscosity of the bonding agent before curing may be from 20 cps. to 500 cps.

In FIG. 4, a semiconductor element 2 is pressed onto the hybrid continuous bonding surface 17 defined by the hard layer 12 and the soft layer 13 to firmly adhere the semiconductor element 2 to the package 3. The bonding surface of the semiconductor element 2 may be cleaned by a suitable chemical cleaning process before bonding.

With the above described semiconductor device, since a sufficiently high bonding strength can be obtained by the hard layer 12 of the high-viscosity bonding agent between the semiconductor element 2 and the package 3, the soft layer 13 of the low-viscosity bonding agent is not required to have a strong adhesion and is sufficient as a filler material for the cavities 19. Therefore, the low-viscosity bonding agent can be selected from a variety of bonding agents including a bonding agent having a viscosity of as low as from 20 cps. to 500 cps.

Also, since the low-viscosity bonding agent exhibits flexibility even at a very low temperature, the internal stresses which would otherwise be generated in the semiconductor element 2 due to the difference in thermal expansion between the semiconductor element 2 and the package 3 are absorbed, thereby virtually preventing the destruction of the semiconductor element 2 by internal stresses.

Figure 1:
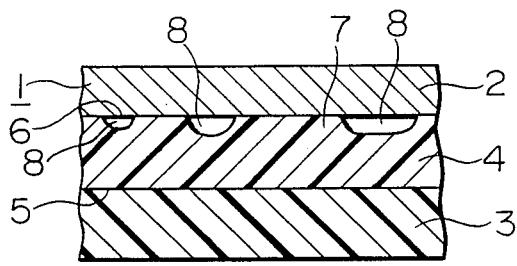
FIG. 1 is a sectional view showing a conventional semiconductor device in which the semiconductor element is bonded to the support member.

Further, since the cavities 19 in the hard layer 12 are filled with the soft layer 13 to define the hybrid continuous bonding surface 17, substantially no voids such as the voids 8 shown in FIG. 1 are formed between the semiconductor element 2 and the bonding layer 14. Therefore, the area of the effective bonding surface is large as compared to the conventional design, and the thermal conduction between the semiconductor element 2 and the package 3 is significantly improved.

Further, since substantially no voids such as shown in FIG. 1 are formed, the hard and soft layers 12 and 13 are not undesirably affected by the moisture trapped within the voids. Also, undesirable effects of the expansion and compression of the trapped air within the voids can be significantly reduced, improving the reliability of the semiconductor device.

What is claimed is:

1. A process for bonding a semiconductor element to a package comprising:
    applying a relatively high-viscosity bonding agent to said package to provide a relatively hard layer having an irregular free surface defining projections and cavities therein, the projections of said hard layer defining a portion of a bonding surface; applying a relatively low-viscosity bonding agent to said irregular free surface of said hard layer to fill the cavities with said low-viscosity bonding agent to provide a relatively soft layer portion of said bonding surface, said bonding surface being continuous and partially defined by said projections of said hard layer and partially defined by said soft layer filled in said cavities of said hard layer; and pressing a semiconductor element onto said continuous bonding surface defined by said hard layer and said soft layer.

2. A process for bonding a semiconductor element as claimed in claim 1, wherein said high-viscosity bonding agent is an epoxy resin and said low-viscosity bonding agent is an urethane resin.

3. A process for bonding a semiconductor element as claimed in claim 1 wherein said high-viscosity bonding agent has a viscosity of from 2,500 cps to 100,00 cps and said low-viscosity bonding agent has a viscosity of from 20 cps to 500 cps.

4. A process for bonding a semiconductor element as claimed in claim 1 including applying high-viscosity bonding agent with a manual applicator.

5. A process for bonding a semiconductor element as claimed in claim 1 including applyings said low-viscosity bonding agent while spinning said package.

* * * * *